United States Patent
Quoc et al.

(10) Patent No.: US 6,277,691 B1
(45) Date of Patent: Aug. 21, 2001

(54) METHOD TO FABRICATE A ROBUST AND RELIABLE MEMORY DEVICE

(75) Inventors: Ngo Dinh Quoc; Yakub Aliyu, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/542,808

(22) Filed: Apr. 4, 2000

(51) Int. Cl.[7] ............................................... H01L 21/8247
(52) U.S. Cl. ........................ 438/261; 438/264; 438/286
(58) Field of Search ................................. 438/257, 587, 438/588, 264, 594, 308, 286, 261; 257/316, 317–322

(56) References Cited

U.S. PATENT DOCUMENTS

| | | | |
|---|---|---|---|
| 4,958,321 | * 9/1990 | Chang | 365/185 |
| 5,350,710 | 9/1994 | Hong et al. | 437/170 |
| 5,393,701 | 2/1995 | Ko et al. | 437/193 |
| 5,441,849 | 8/1995 | Shiraishi et al. | 430/296 |
| 5,620,913 | * 4/1997 | Lee | 438/264 |
| 5,633,186 | * 5/1997 | Shum et al. | 438/264 |
| 5,648,669 | * 7/1997 | Sethi et al. | 257/318 |
| 5,744,834 | * 4/1998 | Lee | 257/321 |
| 5,783,366 | 7/1998 | Chen et al. | 430/311 |
| 5,869,877 | 2/1999 | Patrick et al. | 257/429 |
| 5,965,913 | * 10/1999 | Yuan et al. | 438/257 |
| 6,088,263 | * 7/2000 | Liu et al. | 365/185.14 |

\* cited by examiner

*Primary Examiner*—Michael Lebentritt
(74) *Attorney, Agent, or Firm*—George O. Saile; Rosemary L. S. Pike (57) ABSTRACT

A new method of forming non-volatile memory cells that prevents ion implantation induced damage in the manufacture of an integrated circuit device has been achieved. A tunneling dielectric layer is formed overlying a semiconductor substrate. A first polysilicon layer is deposited. The first polysilicon layer and the tunneling dielectric layer are patterned to form floating gates. An interpoly dielectric layer is deposited. A second polysilicon layer is deposited. The second polysilicon layer and the interpoly dielectric layer are patterned to form control gates overlying said floating gates. A masking layer is deposited overlying the control gates and the semiconductor substrate. The photoresist layer is patterned to form implantation openings in the masking layer for planned heavily doped junctions and to form isolated rings of the masking layer surrounding the implantation openings. Ions are implanted through the implantation openings to thereby complete the heavily doped junctions and the non-volatile memory cells. The isolated rings of the masking layer reduce the antenna effect and do not induce charge flow into the tunneling dielectric layer.

20 Claims, 6 Drawing Sheets

METHOD TO FABRICATE A ROBUST AND RELIABLE MEMORY DEVICE

BACKGROUND OF THE INVENTION

(1) Field of the Invention

The invention relates to a method of fabricating semiconductor structures, and more particularly, to a method of forming non-volatile memories in the manufacture of integrated circuit devices.

(2) Description of the Prior Art

Non-volatile memory cells are an important device type in the art of integrated circuit manufacturing. Non-volatile memory cells, such as EEPROM, are used to hold vital data and programming information in computer systems for a variety of applications. Manufacture of non-volatile memory devices presents unique challenges.

Figure 1:
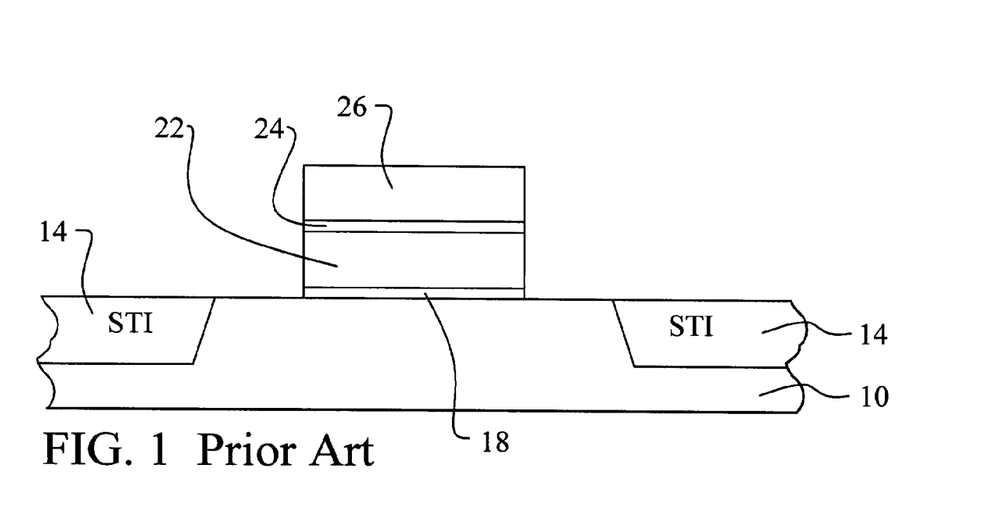
FIGS. 1 through 3 schematically illustrates in cross-section a partially completed prior art integrated circuit device.

Referring now to FIG. 1, a partially completed non-volatile memory cell is illustrated. Many such cells would be formed in a typical non-volatile memory integrated circuit device. A semiconductor substrate 10 is shown with shallow trench isolations (STI) 14 defining the device active area. The defining element of the non-volatile memory cell is the presence of a floating gate. A very thin dielectric layer, called a tunneling dielectric 18 overlies the semiconductor substrate 10. The floating gate 22 is formed overlying the tunneling dielectric 18. The floating gate 22 is comprised of a conductive material, such as doped polysilicon, that is not connected to any other circuit element. A second dielectric layer, called an interpoly dielectric 24, overlies the floating gate 22. Finally, the control gate 26, comprising doped polysilicon, overlies the interpoly dielectric layer 24.

At this point in the manufacturing process, the source and drain regions have not been formed. Once formed, the non-volatile memory cell is essentially a MOSFET with a variable threshold voltage. This threshold voltage varies according to the charge on the floating gate. Under certain conditions, electrons can be moved across the tunneling dielectric to either charge or discharge the floating gate 22. The relative threshold voltage of the cell can then be detected by the sensing circuitry of the integrated circuit to decode the state (logic "0" or "1") of the cell.

Figure 2:
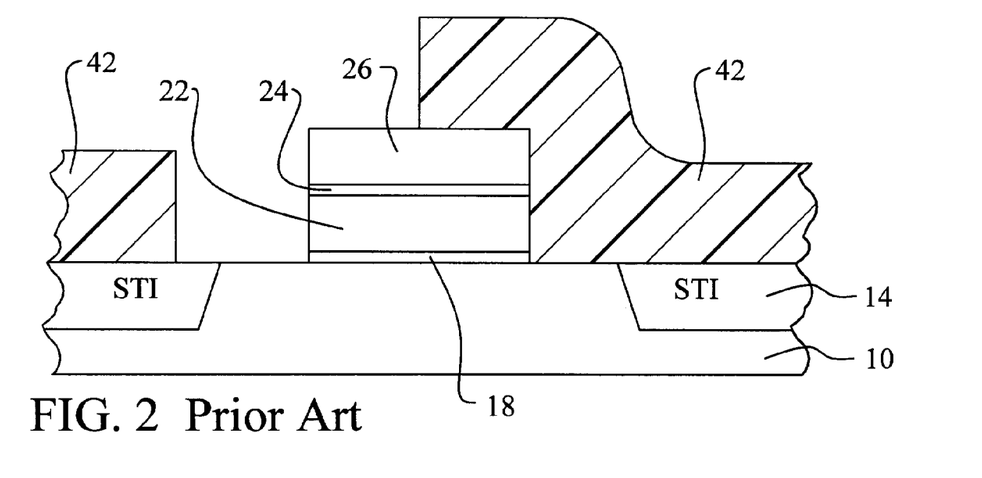

Referring now to FIG. 2, a masking layer 42 of photoresist has been applied overlying the entire surface of the integrated circuit wafer. This masking layer 42 has been patterned to expose a part of the cell. The focus of the exposed area in the semiconductor substrate 10 is the planned drain junction for the cell. The exposed area also overlaps onto the STI 14 and a part of the control gate 26. The only openings formed in the masking layer 42 are for the planned drain junctions. As such, the majority of the integrated circuit surface area is covered by the masking layer 42.

Figure 3:
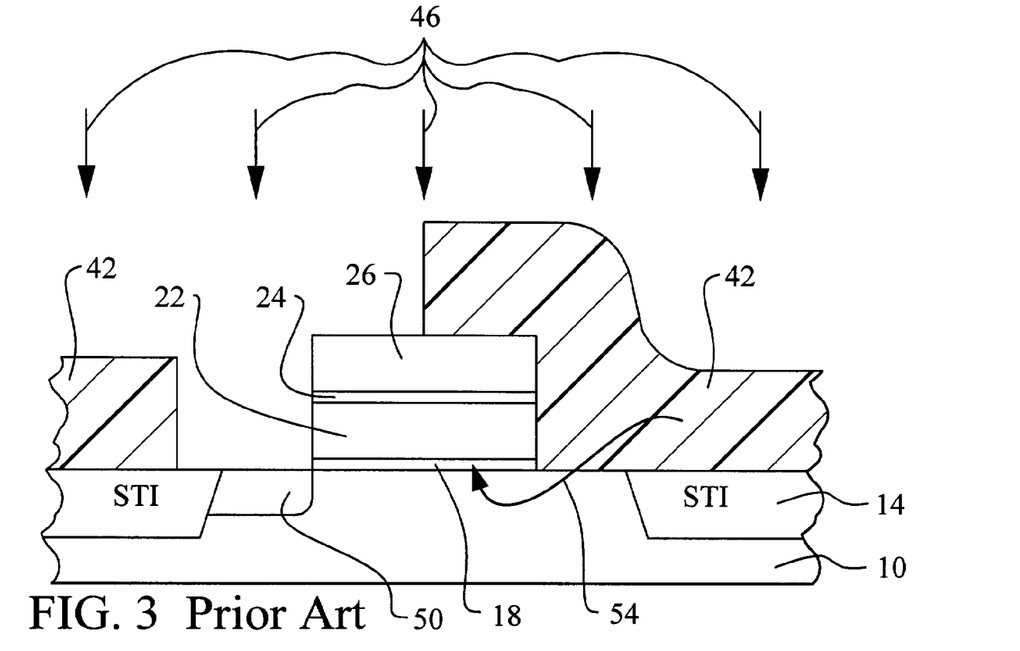

Referring now to FIG. 3, ions are implanted 46 into the surface of the semiconductor substrate 10 to form the heavily doped drain junctions 50. The masking layer 42 shields the implantation 46 from all other parts of the circuit.

A potential problem 54 is depicted in the illustration. The ion implantation process involves focusing a beam of high energy ions 46 at the integrated circuit wafer. Ions that strike the photoresist layer 42 will cause a charge accumulation. This accumulation of charge is sometimes called the antenna effect. If a sufficient amount of charge accumulates in the photoresist layer 42, a relatively large voltage potential may develop between the photoresist and the semiconductor substrate 10. A flow of charge 54 into the semiconductor substrate 10 will then occur and may cause damage to the very thin tunneling dielectric 18. Damage to the tunneling dielectric 18 will severely affect the yield, operation, and reliability of the memory cell.

Figure 4:
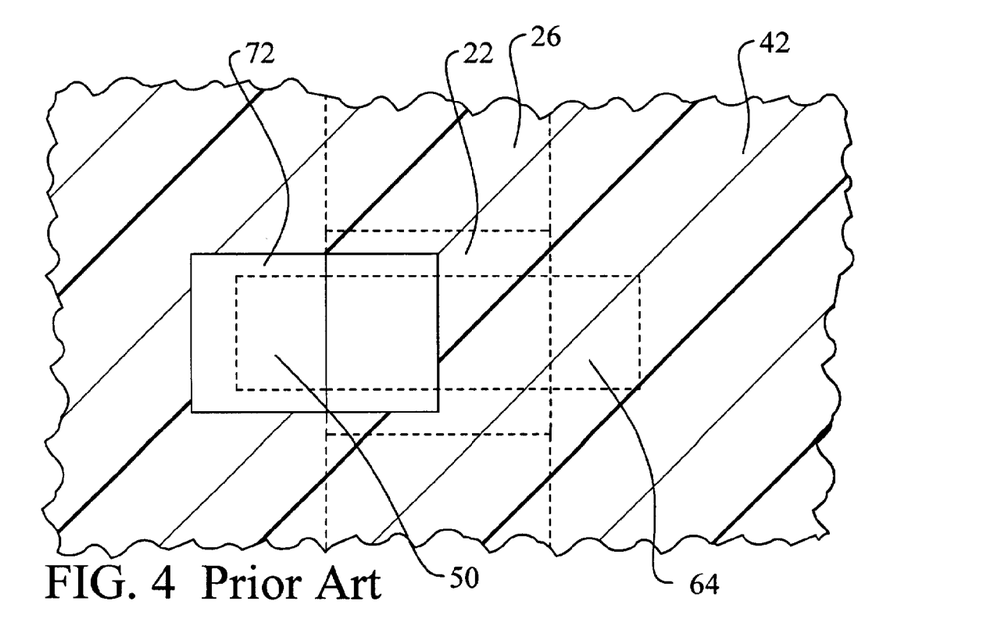
FIG. 4 schematically illustrates a top view of a partially completed prior art integrated circuit device.

Referring now to FIG. 4, a top view of the partially completed non-volatile memory cell is shown. The masking layer 42 covers most of the integrated circuit surface excepting the openings 72 made for the ion implantation. Because of the large surface area of the masking layer 42 of the prior art design, the masking layer 42 forms a large charge-capturing antenna.

Several prior art approaches disclose methods to deal with antenna effects in integrated circuit manufacturing processes. U.S. Pat. No. 5,350,710 to Hong et al discloses a method to form multilevel conductive interconnections using an anti-fuse device. Large metal contact pads, which may act as charge antennas during plasma processes, are connected to the integrated circuit through anti-fuse devices. The anti-fuse devices comprise a thin dielectric connected to a ground reference through a junction in the substrate. The anti-fuse device isolates the large pads from other circuitry. U.S. Pat. No. 5,393,701 to Ko et al teaches a process to eliminate plasma induced damage using temporary open circuits. Metal traces to large contact pads are purposely left open-circuited until all plasma processing is completed. The open circuits are then bridged. U.S. Pat. No. 5,783,366 to Chen et al discloses a method to improve scanning electron microscope (SEM) inspection capability for integrated circuit production wafers. The developed photoresist layer overlying the wafer is ion implanted to increase conductivity and to thereby improve SEM imaging. U.S. Pat. No. 5,869,877 to Patrick et al teaches an apparatus for measuring the voltage potential or current flow between the surface charge collector and the substrate due to plasma charging. The apparatus allows various surface topologies to be used in evaluation and optimization of plasma processes. U.S. Pat. No. 5,441,849 to Shiraishi et al discloses a process to reduce positional deviation of patterning processes. A bottom resist layer is made conductive by radiation exposure. This conductive resist layer reduces charge accumulation during the patterning process to thereby reduce positional deviation.

SUMMARY OF THE INVENTION

A principal object of the present invention is to provide an effective and very manufacturable method to form non-volatile memory cells in the manufacture of integrated circuits.

A further object of the present invention is to provide a method to ion implant heavily doped junctions in the semiconductor substrate in the formation of non-volatile memory cells.

A still further object of the present invention is to prevent ion implantation induced damage to the tunneling dielectric by reducing the charge accumulating surface area of the implantation masking layer.

A yet still further object of the present invention is to improve the robustness and reliability of the non-volatile memory cell.

In accordance with the objects of this invention, a new method of forming non-volatile memory cells that prevents ion implantation induced damage in the manufacture of an integrated circuit device has been achieved. A semiconductor substrate is provided. A tunneling dielectric layer is formed overlying the semiconductor substrate. A first polysilicon layer is deposited overlying the tunneling dielectric layer. The first polysilicon layer and the tunneling dielectric layer are patterned to form floating gates. An interpoly dielectric layer is deposited overlying the floating gates and the semiconductor substrate. A second polysilicon layer is deposited overlying the interpoly dielectric layer. The second polysilicon layer and the interpoly dielectric layer are patterned to form control gates overlying the floating gates. A masking layer is deposited overlying the control gates and the semiconductor substrate. The masking layer is patterned to form implantation openings in the masking layer for planned heavily doped junctions and to form isolated rings of the masking layer surrounding the implantation openings. Ions are implanted through the implantation openings and into the semiconductor substrate to thereby complete the heavily doped junctions and the non-volatile memory cells in the manufacture of the integrated circuit device. The isolated rings of the masking layer do not induce charge flow into the tunneling dielectric layer.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the formation of non-volatile memory cells in the manufacture of integrated circuit devices. It should be clear to those experienced in the art that the present invention can be applied and extended without deviating from the scope of the present invention.

Figure 5:
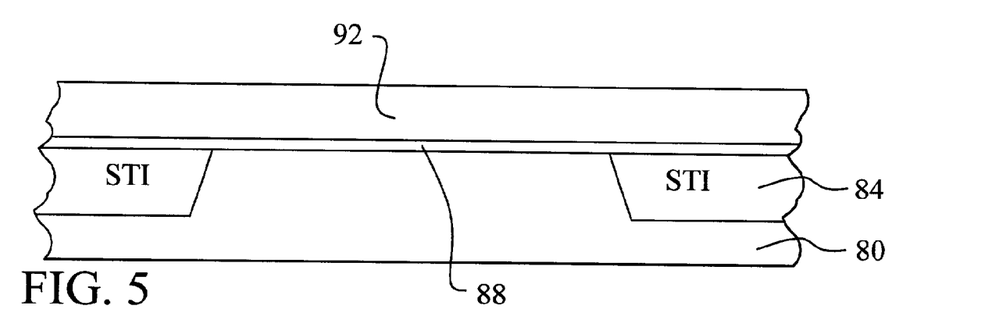
FIGS. 5 through 10 schematically illustrate in cross-sectional representation the preferred embodiment of the present invention.

Referring now particularly to FIG. 5, there is shown a cross-sectional representation of the preferred embodiment of the present invention. A semiconductor substrate 80 is provided. The semiconductor substrate 80 preferably comprises monocrystalline silicon. Shallow trench isolations (STI) 84 are formed in the semiconductor substrate 80 to define the active regions of the integrated circuit device. Field oxide regions, formed using a local oxidation of silicon (LOCOS) technique, could be used in place of the STI 84.

A tunneling dielectric layer 88 is formed overlying the semiconductor substrate 80. The tunneling dielectric layer 88 is essential to the non-volatile memory cell. The tunneling dielectric layer 88 is made sufficiently thin to allow charging and discharging of the subsequently formed floating gate during a programming or erasing event. The tunneling dielectric layer 88 preferably comprises silicon dioxide deposited using a low pressure chemical vapor deposition (LPCVD) process or grown using a thermal oxidation. The tunneling dielectric layer 88 is preferably formed to a thickness of between about 90 Angstroms and 100 Angstroms.

A first polysilicon layer 92 is deposited overlying the tunneling dielectric layer 88. The first polysilicon layer 92 will form the floating gate for the memory cell. The first polysilicon layer 92 is preferably deposited using a LPCVD process and doped to reduce resistivity. The first polysilicon layer 92 is preferably deposited to a thickness of between about 1100 Angstroms and 1300 Angstroms.

Figure 6:
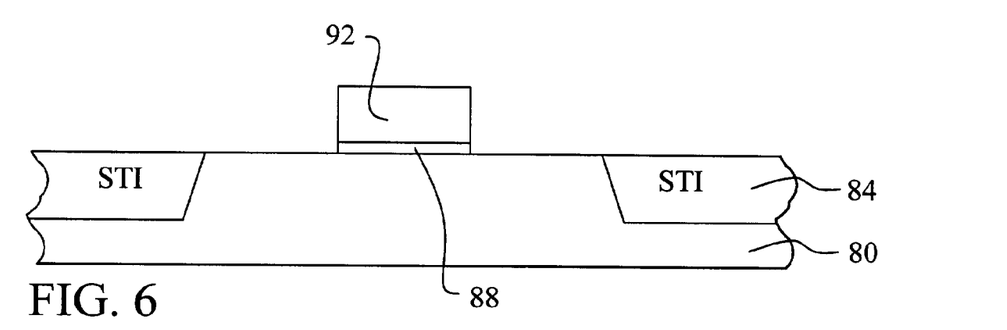

Referring now to FIG. 6, the first polysilicon layer 92 and the tunneling dielectric layer 88 are patterned to form the floating gates for the memory cells. Preferably, a conventional photolithographic process is used to form a patterned mask overlying the first polysilicon layer 92. The first polysilicon layer 92 and the tunneling dielectric layer 88 are then etched through using a conventional reactive ion etch (RIE).

Figure 7:
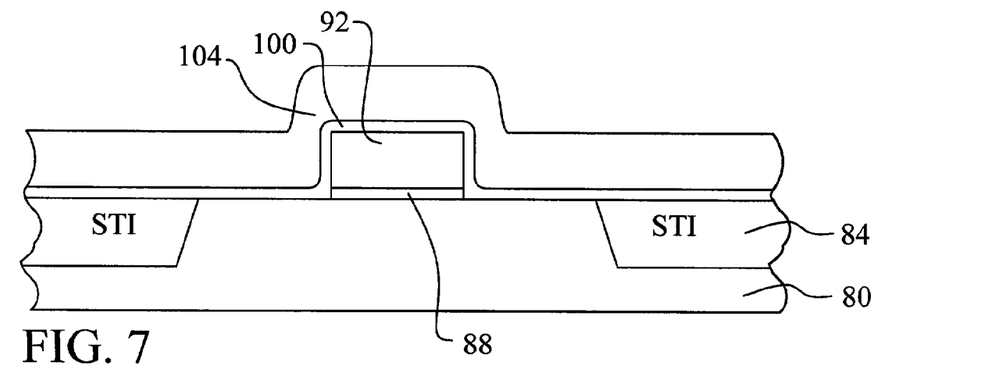

Referring now to FIG. 7, an interpoly dielectric layer 100 is deposited overlying the floating gates 92 and the semiconductor substrate 80. The interpoly dielectric layer 100 will isolate the floating gates 92 from the subsequently deposited second polysilicon layer 104. The interpoly dielectric layer 100 preferably comprises silicon dioxide deposited using a low pressure chemical vapor deposition (LPCVD) process. The interpoly dielectric layer 100 is preferably formed to a thickness of between about 200 Angstroms and 250 Angstroms.

A second polysilicon layer 104 is deposited overlying the interpoly dielectric layer 100. The second polysilicon layer 104 will form the control gate for the completed memory cell. The second polysilicon layer 104 is preferably deposited using a LPCVD process and doped to reduce resistivity. The second polysilicon layer 104 is preferably deposited to a thickness of between about 2500 Angstroms and 2800 Angstroms.

Figure 8:
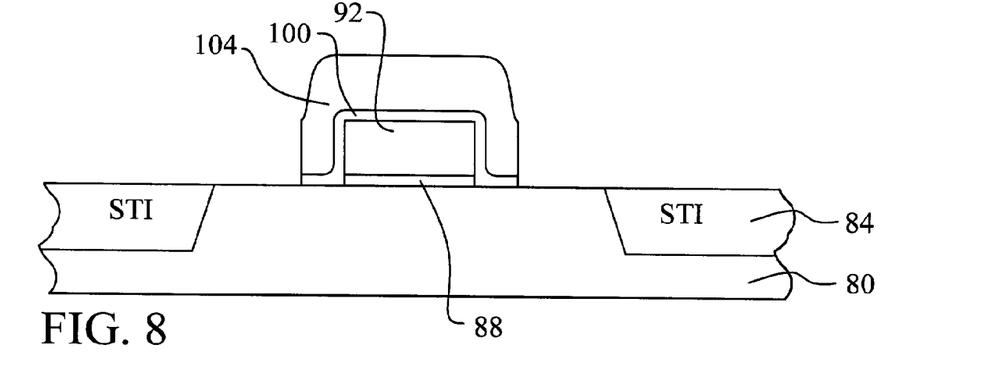

Referring now to FIG. 8, the second polysilicon layer 104 and the interpoly dielectric layer 100 are patterned to form control gates overlying the floating gates. Preferably, a conventional photolithographic process is used to form a patterned masking layer overlying the second polysilicon layer 104. The second polysilicon layer 104 and the interpoly dielectric layer 100 are then etched through using a conventional reactive ion etch (RIE). The completed stack for the memory cell therefore comprises a control gate for the memory cell device with a completed isolated floating gate.

Figure 9:
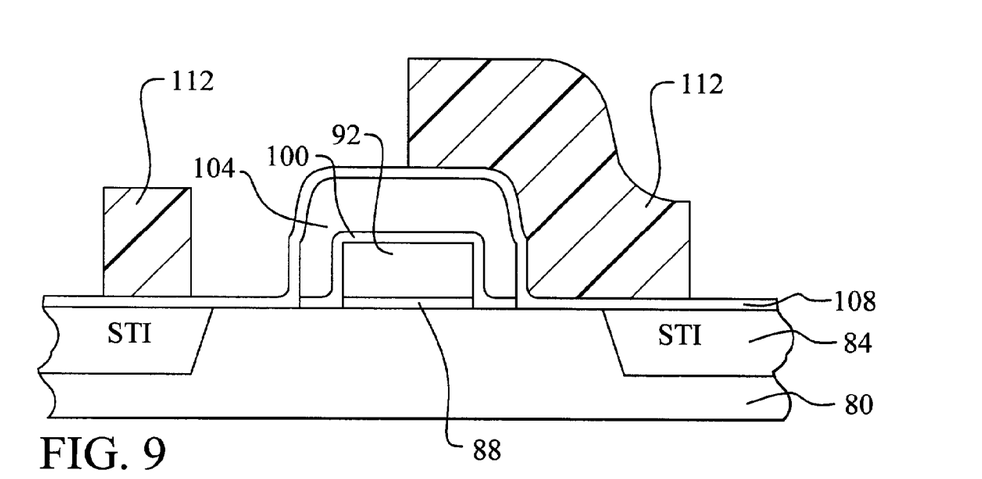

Referring now to FIG. 9, important features of the present invention are illustrated. First, an optional sacrificial oxide layer 108 is deposited overlying the control gates 104 and the semiconductor substrate 80. The purpose of the sacrificial oxide layer 108 is to reduce implanting damage to the surface of the semiconductor substrate 80. A masking layer 112 is deposited overlying sacrificial oxide layer 104. If the sacrificial oxide layer 104 is not used, then the masking layer 112 is deposited overlying the control gates 104 and the semiconductor substrate 80. The masking layer 112 preferably comprises photoresist that is deposited by a spin-on process to a thickness of between about 1500 Angstroms and 2000 Angstroms.

The masking layer 112 is patterned to form implantation openings for planned heavily doped junctions. As shown, openings are formed to implant heavily doped drain junctions into the semiconductor substrate 80. The masking layer 112 is left covering the source side of the memory device. Optionally, the masking layer 112 could be patterned to form openings for both the source and drain junctions to be implanted concurrently.

Drain junctions are formed separately from source junctions in the present invention due to different requirements. The source junctions are deeper and have significant overlap with the floating polysilicon gate to enhance Fowler- Nordheim (F-N) tunneling. However, it is not critical whether the source or the drain is formed first.

Most significantly, the masking layer 112 is patterned to form isolated rings of masking layer 112. The masking layer 112 is left covering only the essential areas needed to define the implantation windows. The remaining masking layer 112 is removed so that rings or "donuts" of masking layer 112 are formed overlying the surface of integrated circuit device. Each ring of masking layer 112 is isolated from all other rings of masking layer 112 so that the surface area of any continuous masking layer 112 is small. By keeping the surface area small, the masking layer 112 is not an effective antenna for accumulating charge as in the prior art example.

Figure 10:
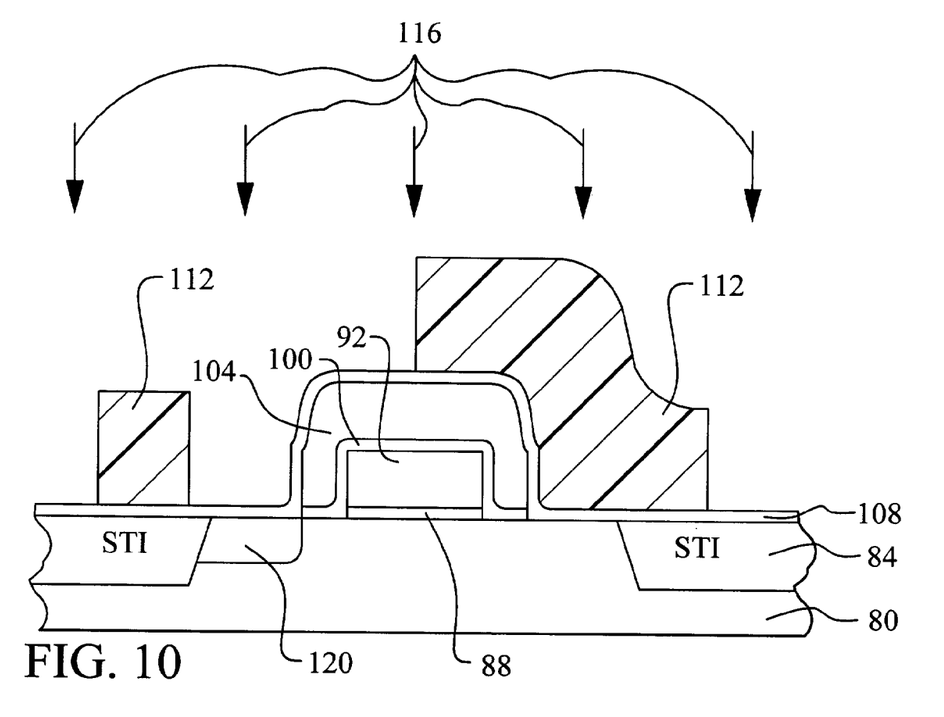

Referring now to FIG. 10, ions are implanted 116 into the semiconductor substrate 80 to form the heavily doped drain junctions 120. The ion implantation 116 preferably comprises arsenic at an implantation dose of between about $5 \times 10^{14}$ atoms/cm$^2$ and $5 \times 10^{15}$ atoms/cm$^2$ and an implantation energy of between about 40 KeV and 60 KeV. The masking layer 112 blocks the implantation from undesirable areas.

In addition, the novel isolated rings of masking layer 112 do not accumulate sufficient charge to induce a large voltage potential from the masking layer 112 to the semiconductor substrate 80. The small surface area of each ring reduces the antenna effect so that no charge damage is caused to the tunneling dielectric layer 88.

Figure 11:
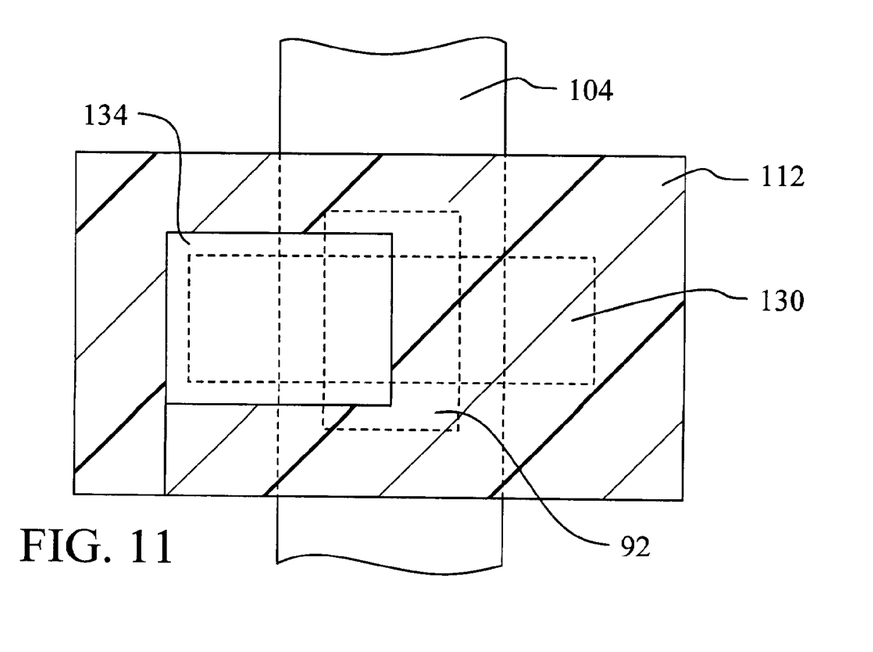
FIG. 11 schematically illustrates a top view of the preferred embodiment of the present invention.

Referring now to FIG. 11, a top view of the partially complete non-volatile memory cell is shown. The masking layer 112, again preferably photoresist material, is shown patterned to form a ring of material. This ring of masking layer 112 covers and overlaps areas to the minimum required by the process capability. Preferably, to reduce the antenna effect, each isolated ring of masking layer 112 is patterned to have a total surface area of not more than about 100 $\mu m^2$. Each ring of masking layer 112 is isolated from all other rings so that no continuous layer is formed.

Figure 12:
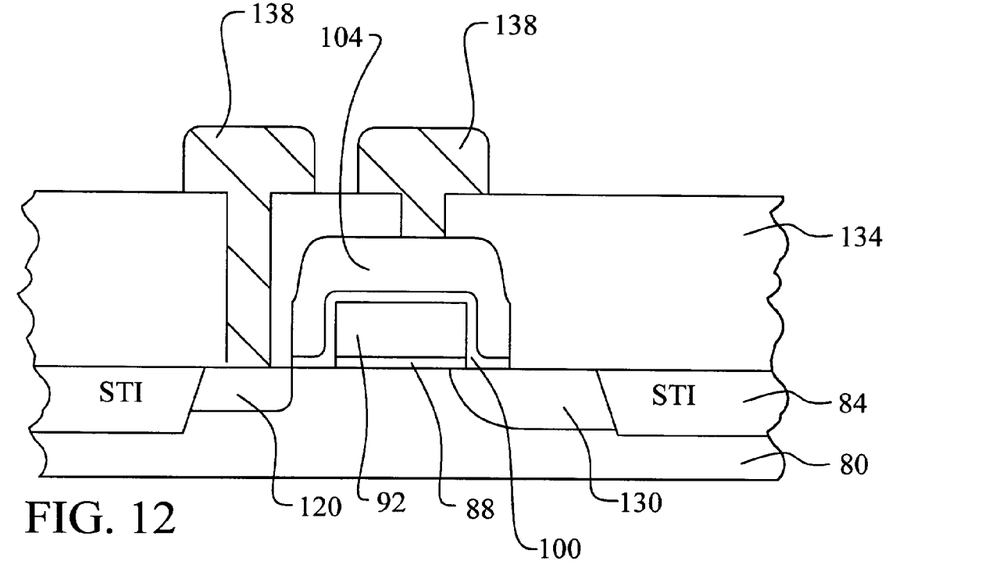
FIG. 12 schematically illustrates a cross sectional view of the preferred embodiment of the present invention.

Referring finally to FIG. 12, the non-volatile memory cell is completed. If source junctions 130 have not been previously implanted (such as would be the case if they were concurrently implanted with the drain junctions), then the source junctions 130 are implanted into the semiconductor substrate 80 to complete the memory cells in the manufacture of the integrated circuit device. Additional processing may be employed to integrate the cells into the overall circuit. An interlevel dielectric layer 134 is deposited overlying the memory cells. Openings are etched through the interlevel dielectric layer 134 for contacts to control gates 104 and junctions. Metal 138 is deposited and patterned to create connectivity to the cells.

As shown in the preferred embodiments, the present invention provides a very manufacturable process for forming non-volatile memory cells in an integrated circuit device. A method is achieved to ion implant heavily doped junctions in the semiconductor substrate in the formation of these cells. Ion implantation induced damage to the tunneling dielectric layer is prevented by reducing the charge accumulating surface area of the implantation masking layer. The surface area of the implantation masking layer is reduced by patterning the masking layer into isolated rings.

While the invention has been particularly shown and described with reference to the preferred embodiments thereof, it will be understood by those skilled in the art that various changes in form and details may be made without departing from the spirit and scope of the invention.

What is claimed is:

1. A method to form heavily doped junctions for non-volatile memory cells in the manufacture of an integrated circuit device comprising:

providing non-volatile memory gate stacks overlying a semiconductor substrate wherein said non-volatile memory gate stacks comprise control gates overlying an interpoly dielectric layer overlying floating gates overlying a tunneling dielectric layer;

depositing a masking layer overlying said non-volatile gate stacks and said semiconductor substrate;

patterning said masking layer to form implantation openings in said masking layer for planned heavily doped junctions and to form isolated rings of said masking layer surrounding said implantation openings; and implanting ions through said implantation openings and into said semiconductor substrate to thereby complete said heavily doped junctions for said non-volatile memory cells in the manufacture of said integrated circuit device wherein said isolated rings of said masking layer do not induce charge flow into said tunneling dielectric layer.

2. The method according to claim 1 wherein said tunneling dielectric layer comprises silicon dioxide.

3. The method according to claim 1 wherein said floating gates comprise polysilicon.

4. The method according to claim 1 wherein said interpoly dielectric layer comprises silicon dioxide.

5. The method according to claim 1 wherein said control gates comprise polysilicon.

6. The method according to claim 1 wherein said masking layer comprises photoresist.

7. The method according to claim 1 wherein said step of ion implantation comprises arsenic at an implantation dose of between about $5 \times 10^{14}$ atoms/cm$^2$ and $5 \times 10^{15}$ atoms/cm$^2$ and an implantation energy of between about 40 KeV and 60 KeV.

8. The method according to claim 1 further comprising depositing a sacrificial oxide layer overlying said non-volatile gate stacks and said semiconductor substrate prior to said step of depositing said masking layer.

9. The method according to claim 1 wherein each of said isolated rings of masking layer have a surface area of not more than about 100 $\mu m^2$.

10. A method to form non-volatile memory cells in the manufacture of an integrated circuit device comprising:

providing a semiconductor substrate;

forming a tunneling dielectric layer overlying said semiconductor substrate;

depositing a first polysilicon layer overlying said tunneling dielectric layer;

patterning said first polysilicon layer and said tunneling dielectric layer to form floating gates;

depositing an interpoly dielectric layer overlying said floating gates;

depositing a second polysilicon layer overlying said interpoly dielectric layer;

patterning said second polysilicon layer and said interpoly dielectric layer to form control gates overlying said floating gates;

depositing a masking layer overlying said control gates and said semiconductor substrate;

patterning said masking layer to form implantation openings in said masking layer for planned heavily doped junctions and to form isolated rings of said masking layer surrounding said implantation openings; and implanting ions through said implantation openings and into said semiconductor substrate to thereby complete said heavily doped junctions and said non-volatile memory cells in the manufacture of said integrated circuit device wherein said isolated rings of said masking layer do not induce charge flow into said tunneling dielectric layer.

11. The method according to claim 10 wherein said tunneling dielectric layer comprises silicon dioxide.

12. The method according to claim 10 wherein said interpoly dielectric layer comprises silicon dioxide.

13. The method according to claim 10 wherein said masking layer comprises photoresist.

14. The method according to claim 10 wherein said step of ion implantation comprises arsenic at an implantation dose of between about $5 \times 10^{14}$ atoms/cm$^2$ and $5 \times 10^{15}$ atoms/cm$^2$ and an implantation energy of between about 40 KeV and 60 KeV.

15. The method according to claim 10 further comprising depositing a sacrificial oxide layer overlying said control gates and said semiconductor substrate prior to said step of depositing said masking layer.

16. The method according to claim 10 wherein each of said isolated rings of masking layer have a surface area of not more than about 100 $\mu$m$^2$.

17. A method to form non-volatile memory cells in the manufacture of an integrated circuit device comprising:

providing a semiconductor substrate;

forming a tunneling dielectric layer overlying said semiconductor substrate;

depositing a first polysilicon layer overlying said tunneling dielectric layer;

patterning said first polysilicon layer and said tunneling dielectric layer to form floating gates;

depositing an interpoly dielectric layer overlying said floating gates;

depositing a second polysilicon layer overlying said interpoly dielectric layer;

patterning said second polysilicon layer and said interpoly dielectric layer to form control gates overlying said floating gates;

depositing a photoresist layer overlying said control gates and said semiconductor substrate;

patterning said photoresist layer to form implantation openings in said photoresist layer for planned heavily doped junctions and to form isolated rings of said photoresist layer surrounding said implantation openings; and implanting ions through said implantation openings and into said semiconductor substrate to thereby complete said heavily doped junctions and said non-volatile memory cells in the manufacture of said integrated circuit device wherein said isolated rings of said photoresist layer do not induce charge flow into said tunneling dielectric layer.

18. The method according to claim 17 wherein said step of ion implantation comprises arsenic at an implantation dose of between about $5 \times 10^{14}$ atoms/cm$^2$ and $5 \times 10^{15}$ atoms/cm$^2$ and an implantation energy of between about 40 KeV and 60 KeV.

19. The method according to claim 17 further comprising depositing a sacrificial oxide layer overlying said control gates and said semiconductor substrate prior to said step of depositing said masking layer.

20. The method according to claim 17 wherein each of said isolated rings of masking layer have a surface area of not more than about 100 $\mu$m$^2$.

* * * * *